(12) United States Patent
Matsuura et al.

(10) Patent No.: US 7,994,528 B2
(45) Date of Patent: Aug. 9, 2011

(54) LIGHT EMITTING DEVICE AND METHOD FOR MANUFACTURING THE SAME

(75) Inventors: Shingo Matsuura, Higashiomi (JP);
Mitsuo Yanagisawa, Higashiomi (JP);
Daisuke Sakumoto, Higashiomi (JP)

(73) Assignee: KYOCERA Corporation, Kyoto (JP)

( * ) Notice: Subject to any disclaimer, the term of this patent is extended or adjusted under 35 U.S.C. 154(b) by 233 days.

(21) Appl. No.: 12/056,893

(22) Filed: Mar. 27, 2008

(65) Prior Publication Data
US 2009/0152580 A1 Jun. 18, 2009

(30) Foreign Application Priority Data
Mar. 28, 2007 (JP) .................. 2007-085153

(51) Int. Cl.
*H01L 33/00* (2010.01)

(52) U.S. Cl. ............ 257/98; 257/E33.059; 257/E21.002

(58) Field of Classification Search ............ 257/98, 257/E33.059, E33.061, E21.002, 99; 438/26; 313/112; 362/184
See application file for complete search history.

(56) References Cited

U.S. PATENT DOCUMENTS
6,717,362 B1 * 4/2004 Lee et al. ............ 313/512
2009/0295265 A1 * 12/2009 Tabuchi et al. ............ 313/112

FOREIGN PATENT DOCUMENTS
WO    WO2006/067885    *   6/2006

* cited by examiner

*Primary Examiner* — Thomas L Dickey
*Assistant Examiner* — Fazli Erdem
(74) *Attorney, Agent, or Firm* — Ditthavong Mori & Steiner, P.C.

(57) ABSTRACT

A light-emitting chip includes a base, a transparent material layer and a light-emitting chip. The base has an upper surface including a conductive pattern. The transparent material layer is disposed on the upper surface of the base and has an opening part which is located on region at least part of the conductive pattern. The light-emitting chip is mounted on the conductive pattern and located in the opening part of the transparent material layer.

2 Claims, 8 Drawing Sheets

LIGHT EMITTING DEVICE AND METHOD FOR MANUFACTURING THE SAME

BACKGROUND

1. Field of the Invention

The present invention relates to light-emitting devices including a light-emitting chip such as a light-emitting diode and method of manufacturing the same.

2. Description of the Related Art

Recently, in a field of an illumination or the like, there have been developed light-emitting devices including a light-emitting chip. The light-emitting is, for example, a light-emitting diode including a plurality of semiconductor layers. As to the development of light-emitting devices, the improvement of light-emitting characteristic has been required. Especially, the improvement of light-emitting intensity of the light-emitting characteristic has been required.

SUMMARY OF THE INVENTION

According to one aspect of the present invention, a light-emitting device has a base, a transparent material layer and a light-emitting chip. The base has an upper surface including a conductive pattern. The transparent material layer is disposed on the upper surface and has an opening part which is located on region at least part of the conductive pattern. The light-emitting chip is mounted on the conductive pattern and is disposed in the opening part of the transparent material layer.

According to one aspect of the present invention, a method for manufacturing a light-emitting device has preparing a base, disposing a transparent material layer and mounting a light-emitting chip. The base has an upper surface including a conductive pattern. The transparent material layer is disposed on the upper surface of the base with state in which the transparent material layer surrounds at least part of the conductive pattern. The light-emitting chip is mounted on a region of the conductive pattern, the region is surrounded by the transparent material layer.

DESCRIPTION OF THE PREFERRED EMBODIMENTS

Figure 1:
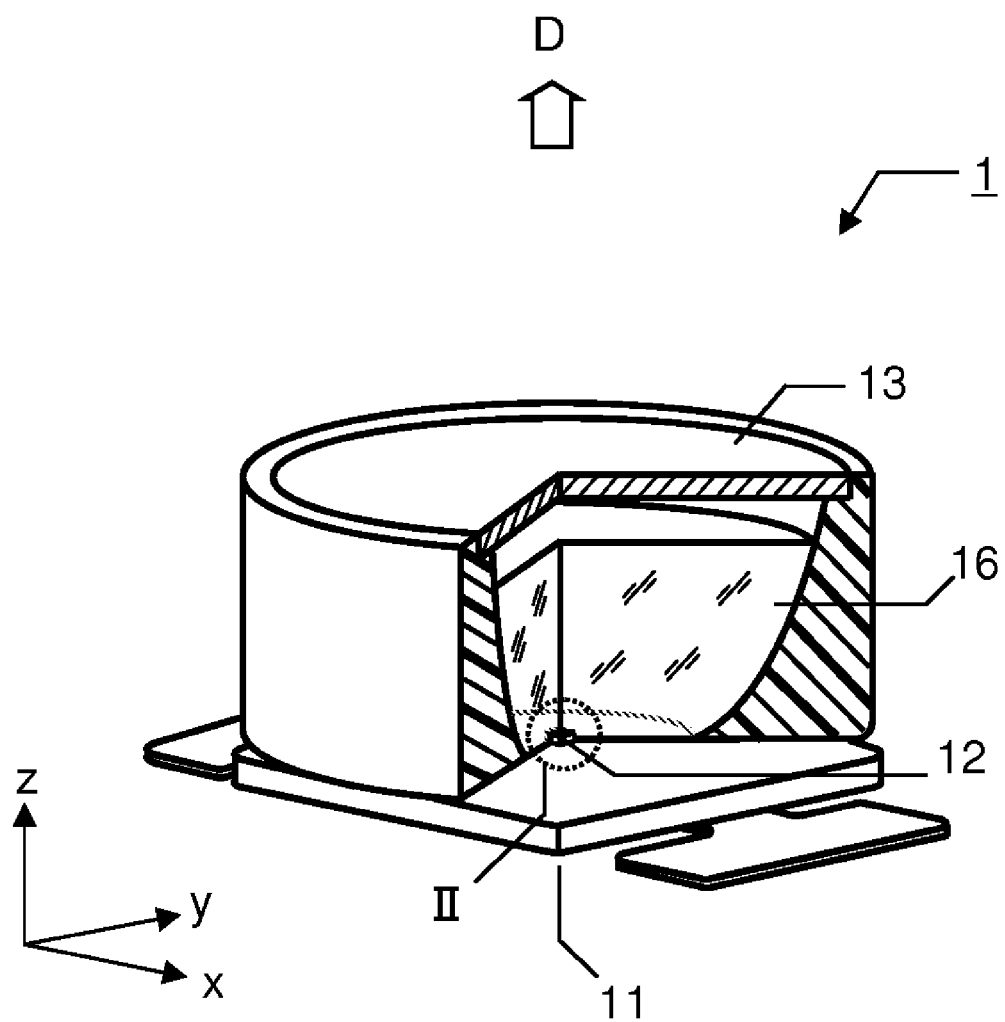
FIG. 1 illustrates a light-emitting device 1 according to one embodiment of the present invention.

As illustrated in FIG. 1, a light-emitting device 1 includes a base 11, a light-emitting chip 12 and a light emitter 13. In FIG. 1, the light-emitting device 1 is mounted on a x-y plane of a virtual xyz space. In FIG. 1, an illustration about a part of the structure of the light-emitting device 1 is omitted so as to represent an inside structure of the light-emitting device 1. A light-emitting direction of the light-emitting device 1 is denoted by a reference code D.

Figure 2:
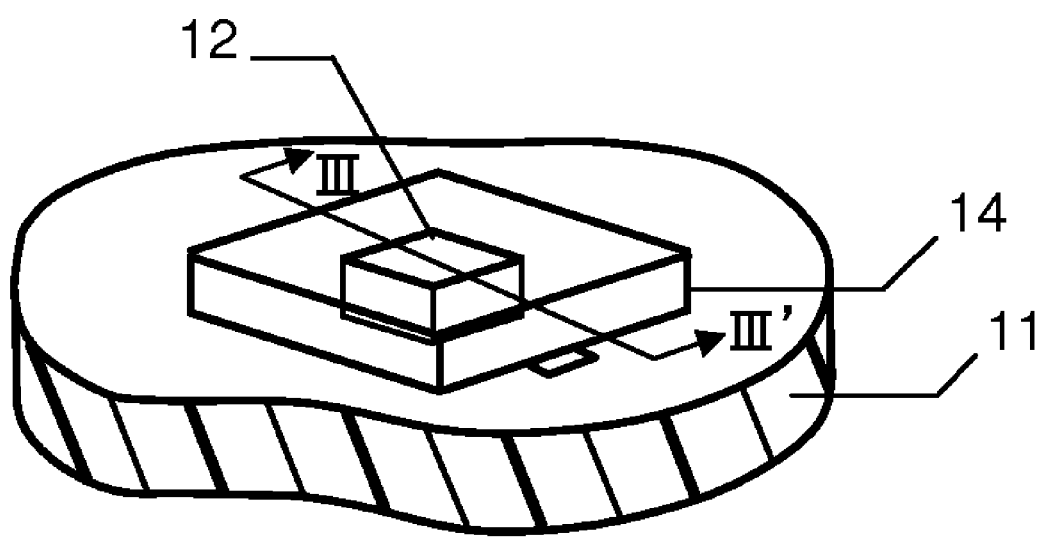
FIG. 2 illustrates an enlarged view for a part denoted by a reference numeral II in FIG. 1.
Figure 3:
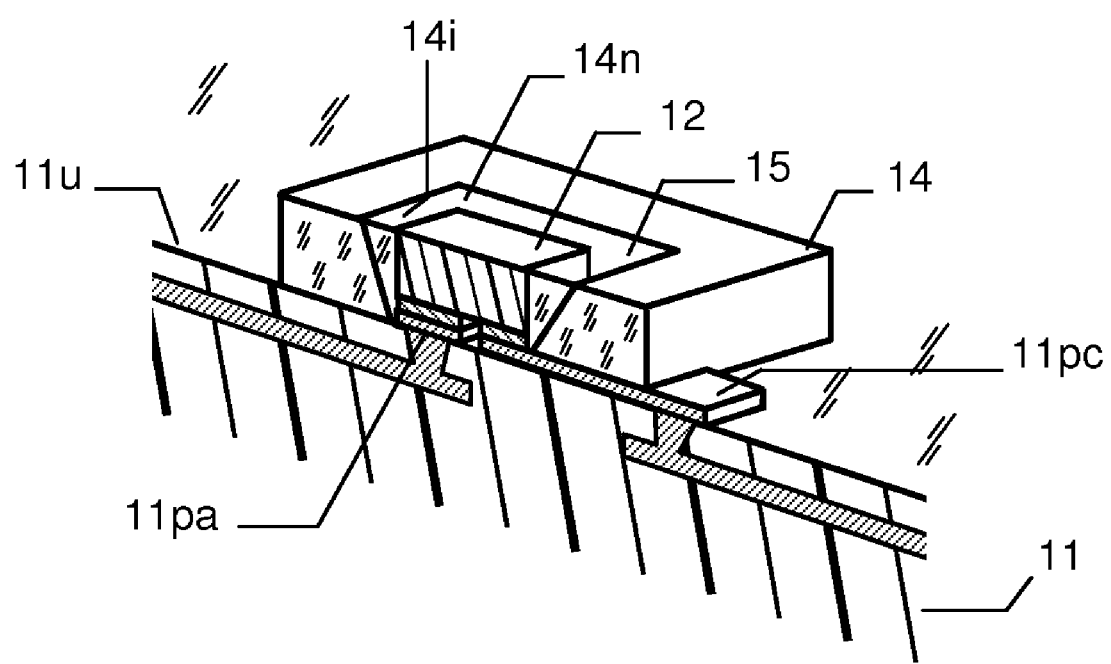
FIG. 3 illustrates a sectional view on a part denoted by a reference numeral III-III' in FIG. 2.

As illustrated in FIG. 2, the light-emitting device 1 further includes a transparent material layer 14. As illustrated in FIG. 3, the light-emitting further includes an intermediate layer 15. In FIG. 3, a sectional view on a part denoted by a reference numeral III-III' in FIG. 2 is denoted by a hatched line.

The base 11 is mainly made of an insulating material. An exemplification of the insulating material is ceramics or resin. The base 11 has a flat plate shape. As illustrated in FIG. 3, the base 11 has an upper surface $11u$ including conductive patterns $11pa$ and $11pc$.

The light-emitting chip 12 is mounted on conductive patterns $11pa$ and $11pc$. The light-emitting chip 12 is electrically connected to conductive patterns $11pa$ and $11pc$. The light-emitting chip 12 is located in an opening part $14n$ of the transparent material layer 14. The light-emitting chip 12 is a light-emitting diode made of a semiconductor material. The light-emitting chip 12 is a light source emits a primary light. The primary light has a wavelength included blue range or ultraviolet range.

Figure 4:
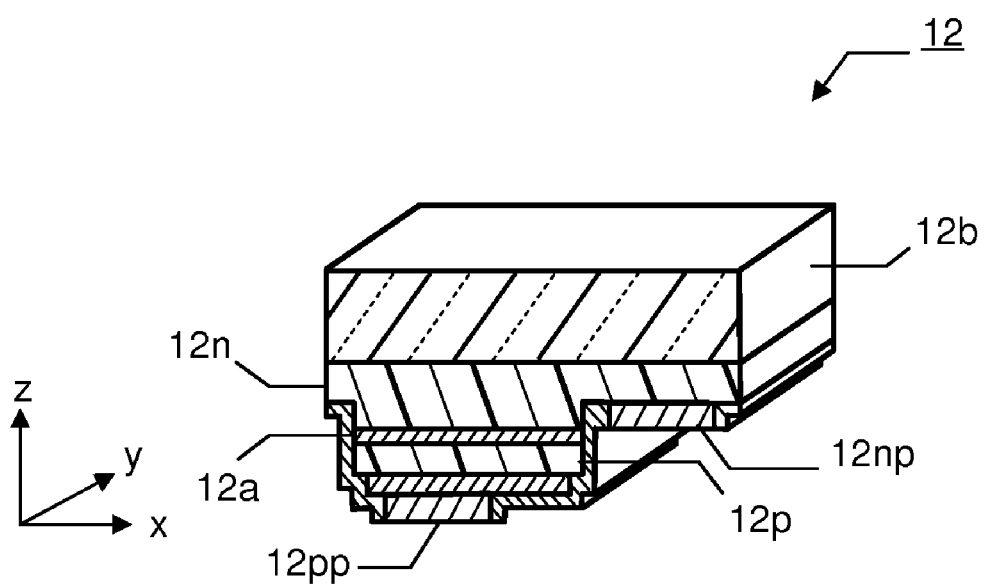
FIG. 4 illustrates a light-emitting chip 12.

As illustrated in the FIG. 4, the light-emitting chip 12 has a plurality of semiconductor layers $12n$, $12a$ and $12p$. In FIG. 4, the light-emitting chip 12 is mounted on a x-y plane of a virtual xyz space. In FIG. 4, a sectional view is denoted by a hatched line.

The n-type semiconductor layer $12n$ and the p-type semiconductor layer $12p$ are stacked on a transparent substrate $12b$. The semiconductor active layer $12a$ is formed between the n-type semiconductor layer $12n$ and the p-type semiconductor layer $12p$. In FIG. 4, a side surface of the light-emitting chip 12 is a surface viewed from direction of x-y plane.

The light-emitting chip 12 has electrodes $12pp$ and $12np$. The p-electrode $12pp$ is formed on the p-type semiconductor layers $12p$. The n-electrode $12np$ is formed on the n-type semiconductor layer $12n$. The p-electrode $12pp$ is electrically connected to the conductive pattern $11pa$. The n-electrode $12np$ is electrically connected to the conductive pattern $11pc$. The conductive pattern $11pa$ is an anode. The conductive pattern $11pc$ is a cathode. The light-emitting chip 12 is mounted by the flip-chip bonding.

An edge part of the conductive pattern $12pc$ is located on outside of the transparent material layer 14. With at least one conductive pattern of the conductive pattern $11pa$ or the conductive pattern $11pc$ is leaded out to the outside of the transparent material layer 14, a part of a heat generated by the light-emitting chip 12 is conducted to outside of transparent material layer 14. Therefore a heat accumulating in a inside of the transparent material layers 14 is reduced.

A light emitter 13 emits a secondary light. The secondary light has a different wavelength from the primary light. A wavelength of the secondary light is larger than a wavelength of the primary light. The light emitter 13 includes a matrix material having a transparency and a fluorescent material. The transparency of the matrix material refers to a property that allows at least part of the primary light emitted from the light-emitting chip 12 to pass. A light emitted from the fluorescent material passes the matrix material. An exemplification of the matrix material is resin. The fluorescent material is exited by the primary light emitted from the light-emitting chip 12.

As illustrated in FIG. 2, the transparent material layer 14 surrounds the light-emitting chip 12. A transparency of the layer 14 refers to a property that allows at least part of the primary light emitted from the light-emitting chip 12 to pass.

The transparent material layer 14 has the opening part $14n$. The light-emitting chip 12 is located in the opening part $14n$.

The light-emitting chip 12 is partially covered by the transparent material layer 14. The transparent material layer 14 surrounds side surfaces of the light-emitting chip 12. With side surfaces of the light-emitting chip 12 are covered by the transparent material layer 14, a drawing efficiency a light emitted from side surfaces of the light-emitting chip 12 is improved. A heat generated by the light-emitting chip 12 is easily diffused above the light-emitting chip 12. In the other ward, a heat is easily diffused above the opening part 12n of the transparent material layer 14.

The intermediate layer 15 is disposed between side surfaces of the light-emitting chip 12 and an inner surface 14i of the transparent material layer 14. The intermediate layer 15 has a transparency. The transparency of the intermediate layer 15 refers to a property that allows at least part of the primary light emitted from the light-emitting chip 12 to pass. An exemplification of a material of the intermediate layer 15 is resin.

The intermediate layer 15 has porosity larger than the transparent material layer 14, smaller than the light-emitting chip 12. With each porosity of mediums are dwindle from the light-emitting chip 12 to the transparent material layer 14, a possibility that interfaces of mediums reflects the primary light emitted from light-emitting chip 12 by the total reflection are lower. Therefore, a drawing efficiency the primary light emitted from side surfaces of the light-emitting chip 12 is improved.

Figure 5:
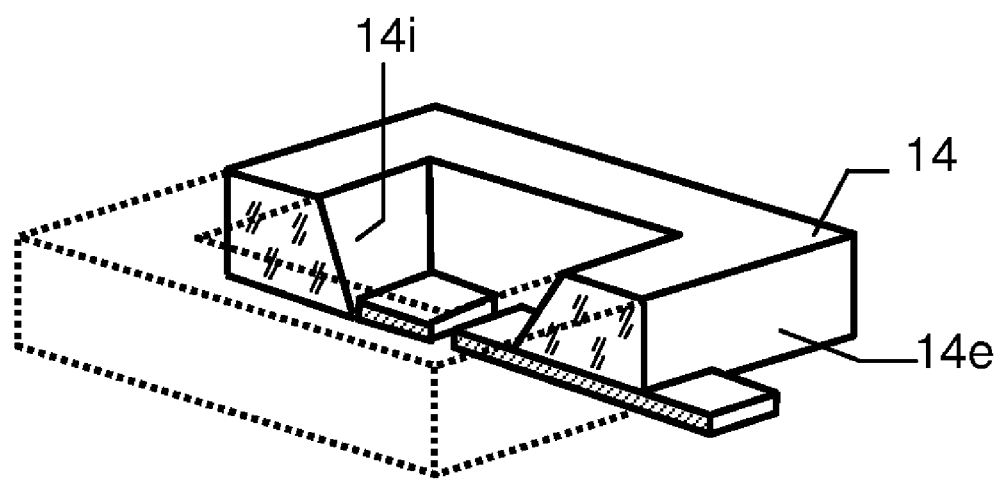
FIG. 5 illustrates a transparent resin layer 14.

An interface between the intermediate layer 15 and the transparent material layer is slope. More specifically, as illustrated in FIG. 5, the inner surface 14i of the transparent material layer 14 is slope. In FIG. 5, the transparent material layer 14 is partially denoted by a dot line.

The inner surface 14i reflects a part of the primary light emitted from side surfaces of the light-emitting chip 12 by the total reflection. A traveling direction of the primary light emitted from the light-emitting chip 12 is defined by an angle of gradient of the inner surface 14i.

With the inner surface 14i of the transparent material layer 14 is sloped, the traveling direction of the primary light emitted from sides of the light-emitting chip 12 is controlled. The inner surface 14i is has extended up. Therefore an upward irradiance level of the primary light emitted from sides of the light-emitting chip 12 is increased.

As illustrated in FIG. 1, the light-emitting device 1 further includes an encapsulating layer 16. The encapsulating layer 16 covers the light-emitting chip 12, the transparent material layer 14 and the intermediate layer 15. The encapsulating layer 16 has transparency. The transparency of the encapsulating layer 16 refers to a property that allows at least part of the primary light emitted from the light-emitting chip 12 to pass. An exemplification of a material of the encapsulating layer 16 is resin.

The encapsulating layer 16 adheres to the outer surface 14e. The encapsulating layer 16 has an index of refraction smaller than the transparent material layer 14. Therefore, with the index of refraction of each medium has gradually become small from light-emitting chip 12 to the encapsulating layer 16, the possibility that do the total reflection of the primary light emitted from the light-emitting chip 12 in the interface of each medium is decreased. Therefore, taking out efficiency of the primary light emitted from sides of the light-emitting chip 12 has been improved. The encapsulating layer 16 is covered by the light emitter 13.

Figure 6:
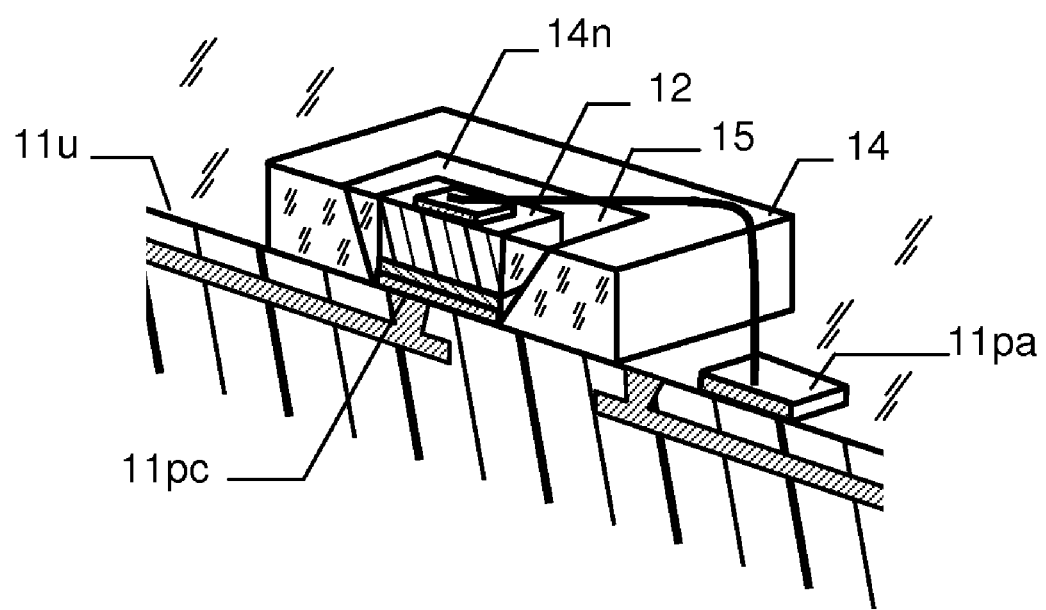
FIG. 6 illustrates another mounting structure of the light-emitting chip 12.

As illustrated in FIG. 6, another mounting method of the light-emitting chip 12 is the method by wire-bonding. A part of heat generated by the light-emitting chip 12 is conducted to exterior space of the transparent material layer 14 a bonding wire. The influence of heat in light-emitting device 1 is decreased.

Figure 7:
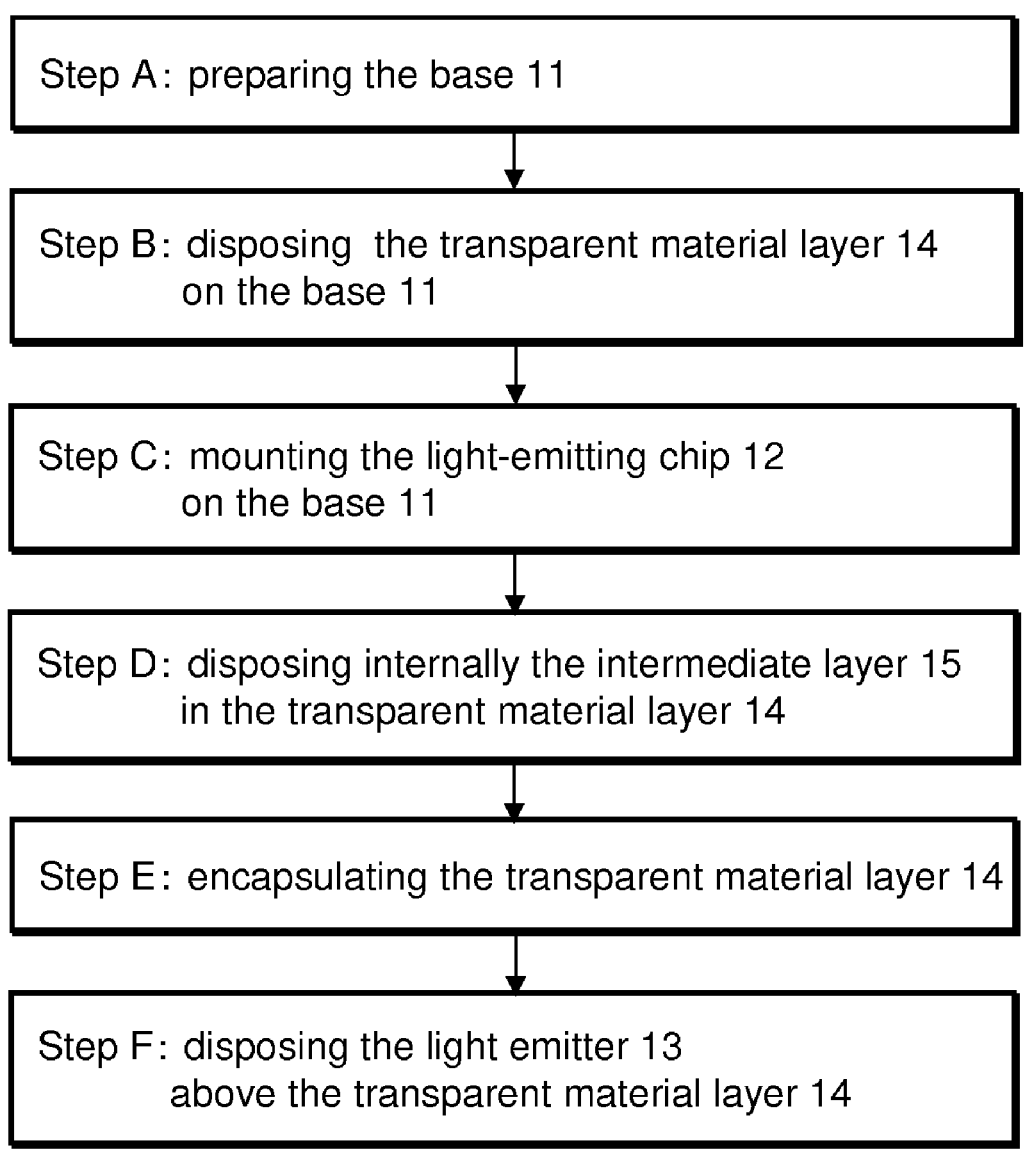
FIG. 7 illustrates a method for manufacturing the light-emitting device 1.

A method of manufacturing of the light-emitting device 1 is expounded with reference to FIG. 7.

In step A, The base 11 is prepared. The base 11 has the upper surface 11u including conductive patterns 11pa and 11pc.

In step B, the transparent material layer 14 is disposed on the base 11. The transparent material layer 14 surrounds a part of at least region of conductive patterns 11pa and 11pc. An exemplification of the step B includes bonding a prepared frame member to the upper surface 11u of the base 11. Another exemplification of the step B includes pouring a transparent material in a softened state into a mold disposed on the upper surface 11u of the base 11. The transparent material poured into the mold is solidified.

In step C, the light-emitting chip 12 is mounted on the base 11. The light-emitting chip 12 is electrically connected to conductive patterns 11pa and 11pc. The light-emitting chip 12 is disposed internally in the transparent material layer 14. The light-emitting chip 12 is dispose in the opening part 14n in transparent material layer 14. Therefore, the mounting accuracy of light-emitting chip 12 has been improved. With the inner surface 14i of the transparent material layer 14 is sloped, the mounting accuracy of light-emitting chip 12 has been improved. The opening part 14n of the transparent material layer 14 has the size corresponding to the size of light-emitting chip 12.

In step D, the intermediate layer 15 is disposed internally in the transparent material layer 14. The transparent material of the intermediate layer 15 is poured in a softened state between the light-emitting chip 12 and the transparent material layer 14. The transparent material of the intermediate layer 15 is solidified.

In step E, the transparent material layer 14 is encapsulated. The encapsulating layer 16 is disposed on the light-emitting chip 12 and the transparent material layer 14.

In step F, the light emitter 13 is disposed above the transparent material layer 14. The light emitter 13 is apart from the encapsulating layer 16.

Figure 8:
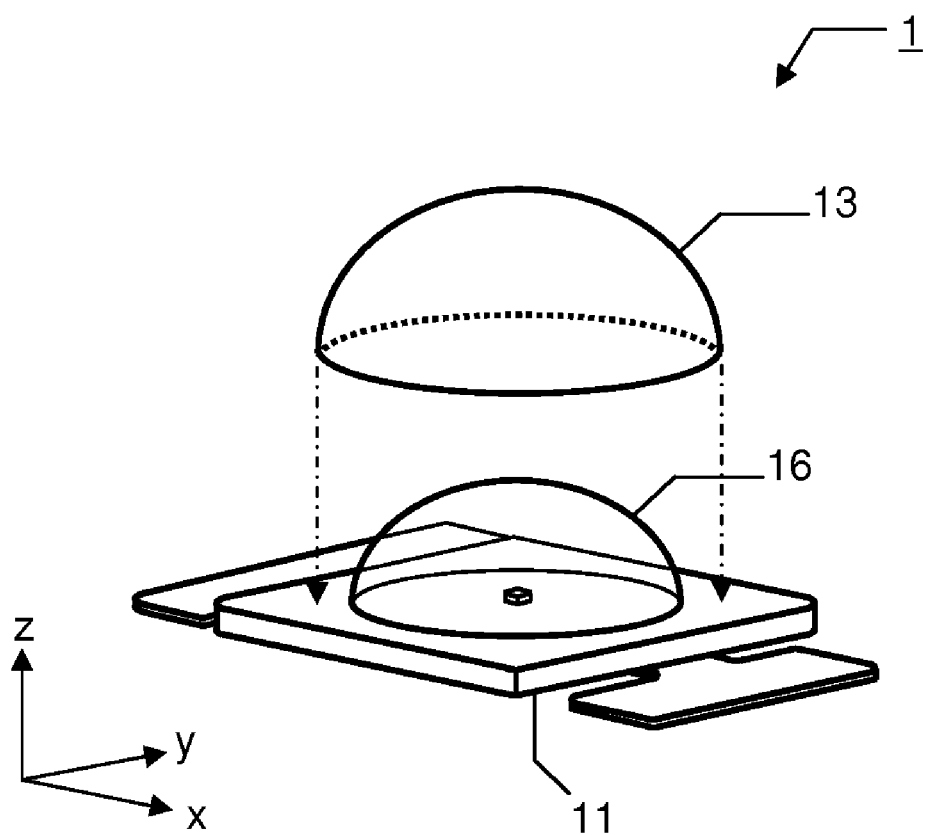
FIG. 8 illustrates the light-emitting device 1 according to another embodiment of the present invention.

A light-emitting device 1 in another embodiment is expounded with reference to FIG. 8. In the light-emitting device 1, difference from the composition illustrated in FIG. 1 is shape of the light emitter 13 and the encapsulating layer 16. The light emitter 13 and the encapsulating layer 16 have the dome shape. The encapsulating layer 16 is covered by the light emitter 13. Other compositions are similar to the composition illustrated in FIG. 1.

The invention claimed is:

1. A light-emitting device comprising:
a base having an upper surface including a conductive pattern;
a light-emitting chip mounted on the conductive pattern and having a side surface;
a transparent material layer disposed on the upper surface of the base to surround the light-emitting chip and having an inner surface to face the side surface of the light-emitting chip, the inner surface being sloped so that a distance between the side surface and the inner surface facing the side surface increases as the inner surface is extended away from the upper surface of the base;

an intermediate layer disposed between the side surface of the light-emitting chip and the inner surface of the transparent material layer to contact the side surface of the light-emitting chip and having a refractive index larger than a refractive index of the transparent material layer; and an encapsulating layer provided on an upper surface of the transparent material layer and an upper surface of the light-emitting chip to contact the upper surface of the transparent material layer and the upper surface of the light-emitting chip, the encapsulating layer having a refractive index smaller than a refractive index of the intermediate layer.

2. The light-emitting device according to claim 1, wherein the light-emitting chip is mounted on the conductive pattern by flip-chip bonding.

* * * * *